US006847164B2

(12) United States Patent
Janaway et al.

(10) Patent No.: US 6,847,164 B2
(45) Date of Patent: Jan. 25, 2005

(54) CURRENT-STABILIZING ILLUMINATION OF PHOTOCATHODE ELECTRON BEAM SOURCE

(75) Inventors: Gordon Janaway, Tucson, AZ (US); Steven Coyle, Alameda, CA (US)

(73) Assignee: Applied Matrials, Inc., Santa Clara, CA (US)

( * ) Notice: Subject to any disclaimer, the term of this patent is extended or adjusted under 35 U.S.C. 154(b) by 0 days.

(21) Appl. No.: 10/316,970

(22) Filed: Dec. 10, 2002

(65) Prior Publication Data

US 2004/0108812 A1 Jun. 10, 2004

(51) Int. Cl.$^7$ ............................................. H01J 40/06
(52) U.S. Cl. ..................... 313/542; 313/530; 313/541; 250/214 VT; 250/492.2
(58) Field of Search ............................. 313/542, 530, 313/541, 544; 250/214 VT, 492.2, 492.24, 423 P

(56) References Cited

U.S. PATENT DOCUMENTS

| 3,388,280 A | 6/1968 | De Lucia ..................... 372/4 |
| 3,575,629 A | 4/1971 | O'Keeffe et al. ........... 313/524 |

(List continued on next page.)

FOREIGN PATENT DOCUMENTS

| EP | 0206422 | 12/1986 |
| EP | 0434018 | 6/1991 |
| EP | 0882812 A1 | 12/1998 |
| EP | 1049133 A3 | 11/2000 |
| JP | 61214324 | 9/1986 |
| JP | 02211687 | 8/1990 |
| JP | 05082257 | 4/1993 |
| JP | 05159694 | 6/1993 |
| JP | 07014503 | 1/1995 |
| JP | 08148300 | 6/1996 |
| JP | 10228876 | 8/1998 |
| WO | WO-9703453 | 1/1997 |

OTHER PUBLICATIONS

Jiang et al., "Photoemission from gold thin films for application in multiphotocathode arrays for electron beam lithography," J. Vac. Sci. Technol. B, Nov/Dec 1998, 16(6).
Mankos et al., "Multisource optimization of a column for electron lithography," J. Vac. Sci. Technol. B, Nov/Dec 2000, 18(6).
Mankos et al., "Basic constraints for a multibeam lithography column," J. Vac. Sci. Technol. B, Mar/Apr 2001, 19(2).
Coyle et al., "Progress toward a high–brightness photoemission source for multiple–electron beam lithography," J. Vac. Technol. B, Nov/Dec 2001, 19(6).
Coyle et al., "Progress toward a high–brightness photoemission source for multiple electron–beam lithography," copies of slides of presentation given at 2001 EIPBN (International Conference on Electron, Ion and Photon Beam technology and Nanofabrication), May 29–Jun. 1, 2001, Washington, DC, USA.

Primary Examiner—Joseph Williams
Assistant Examiner—Kevin Quarterman
(74) Attorney, Agent, or Firm—Ashok Janah

(57) ABSTRACT

An electron beam source has a photocathode with a photoemitter material having a work function, and with a beam receiving portion and an electron emitting portion. A first light source directs a first light beam onto the beam receiving portion of the photocathode to generate an electron beam from the electron emitting portion. The first light beam has a wavelength $\lambda_1$ such that $hc/\lambda_1$ is at least about the work function of the photoemitter material, where 'h' is Planck's constant and 'c' is the speed of light. A second light source directs a second light beam onto the beam receiving portion of the photocathode, such as onto the beam receiving portion, to stabilize the electron beam. The second light beam having a wavelength $\lambda_2$ such that $hc/\lambda_2$ is less than about the work function of the photoemitter material.

10 Claims, 3 Drawing Sheets

U.S. PATENT DOCUMENTS

| | | | | |
|---|---|---|---|---|
| 3,594,583 | A | * 7/1971 | Sheldon | 250/210 |
| 3,689,798 | A | 9/1972 | Brukovsky et al. | 315/106 |
| 3,825,839 | A | 7/1974 | Someya et al. | 315/107 |
| 3,860,821 | A | * 1/1975 | Barrett | 250/363.01 |
| 3,864,572 | A | 2/1975 | Van der Mast et al. | 250/306 |
| 3,885,194 | A | 5/1975 | Schumacher | 315/107 |
| 3,909,662 | A | 9/1975 | Thomas et al. | 315/106 |
| 3,909,663 | A | 9/1975 | Thomas et al. | 315/106 |
| 4,341,427 | A | 7/1982 | Tomasetti et al. | 445/6 |
| 4,460,831 | A | 7/1984 | Oettinger et al. | 250/492.2 |
| 4,467,205 | A | 8/1984 | Beisswenger et al. | 250/397 |
| 4,820,927 | A | 4/1989 | Langner et al. | 250/492.2 |
| 5,039,862 | A | 8/1991 | Smith et al. | 250/423 P |
| 5,684,360 | A | 11/1997 | Baum et al. | 313/542 |
| 5,932,966 | A | * 8/1999 | Schneider et al. | 313/542 |
| 6,005,247 | A | * 12/1999 | Baum | 250/310 |
| 6,320,932 | B2 | 11/2001 | Dinsmore | 378/65 |
| 6,335,783 | B1 | 1/2002 | Kruit | 355/52 |
| 6,448,568 | B1 | * 9/2002 | Allen et al. | 250/492.24 |
| 6,476,401 | B1 | 11/2002 | Veneklasen et al. | 250/492.24 |
| 2001/0001226 | A1 | 5/2001 | Nihashi | |

* cited by examiner

CURRENT-STABILIZING ILLUMINATION OF PHOTOCATHODE ELECTRON BEAM SOURCE

GOVERNMENT SUPPORT

This invention was made with Government support under Contract Number N00019-97-C-2010 and Contract Number N66001-99-C-9624 awarded by the Defense Advanced Research Projects Agency of the Department of Defense and the Naval Air Systems Command (NAVAIR) of the Department of the Navy. The Government has certain rights in the invention.

BACKGROUND

Embodiments of the present invention relate to the generation or inspection of an electron beam pattern on a substrate.

An electron beam apparatus is capable of scanning one or more electron beams onto a substrate to generate or inspect an electron beam pattern on the substrate. A typical electron beam apparatus comprises a vacuum chamber enclosing electron beam source, focuser, and detector components. The electron beam source components generate electron beams that are modulated and scanned across the substrate to generate or inspect the electron beam pattern on the substrate.

One commonly used electron beam source of the electron beam apparatus comprises a photocathode. The photocathode has a photoemissive layer that is typically fabricated on a transparent layer. A light beam is directed onto the photoemissive layer of the photocathode to cause the photocathode to emit an electron beam, and the light beam is turned on and off to blank the electron beam on and off.

However, conventional photocathode electron beam sources often have electron current levels that undesirably fluctuate during operation of the photocathode. These electron beam current fluctuations adversely affect the operation of the electron beam apparatus. For example, poor electron beam stability can result in variable exposure levels across the substrate in pattern generation, thereby limiting the quality and resolution of the pattern being generated on the substrate. Fluctuating electron beam current levels also affect the level of precision at which a substrate can be inspected.

Thus, it is desirable to have an electron beam source and electron beam apparatus capable of generating a stable electron beam during operation. It is further desirable for the electron beam source to provide a reliable and consistent electron beam current.

SUMMARY

An electron beam source comprises a photocathode comprising a photoemitter material having a work function, the photocathode comprising a beam receiving portion and an electron emitting portion. A first light source directs a first light beam onto the beam receiving portion of the photocathode to emit an electron beam from the electron emitting portion, the first light beam having a wavelength $\lambda_1$ such that $hc/\lambda_1$ is at least about the work function of the photoemitter material, where 'h' is Planck's constant and 'c' is the speed of light. A second light source directs a second light beam onto the beam receiving portion of the photocathode, the second light beam having a wavelength $\lambda_2$ such that $hc/\lambda_2$ is less than about the work function of the photoemitter material.

An electron beam apparatus for generating or inspecting a pattern on a substrate comprises a vacuum chamber and an electron beam source, as described in the previous paragraph, to provide an electron beam in the vacuum chamber. A substrate support supports a substrate, and an electron beam focuser and scanner focus and scan the electron beam across the substrate to generate or inspect a pattern on the substrate.

An electron beam source comprises a photocathode having a beam-receiving portion and an electron emitting portion. A method of generating an electron beam from the electron beam source comprises providing a photocathode comprising a photoemitter material having a work function. A first light beam is directed onto the beam receiving portion of the photocathode to emit an electron beam from the electron emitting portion, the first light beam having a wavelength $\lambda_1$ such that $hc/\lambda_1$ is at least about the work function of the photoemitter material, where 'h' is Planck's constant and 'c' is the speed of light. A second light beam is directed onto the beam receiving portion of the photocathode, the second light beam having a wavelength $\lambda_2$ such that $hc/\lambda_2$ is less than about the work function of the photoemitter material.

A method of generating or inspecting a pattern on a substrate comprises supporting a substrate in a vacuum zone and generating an electron beam in the vacuum zone, as described in the previous paragraph. The electron beam is modulated and scanned across the substrate to generate or inspect a pattern on the substrate.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Embodiments of an electron source according to the present invention are capable of emitting electrons that may be used for many different applications, including for example, generating or inspecting a pattern on a substrate.

Figure 1:
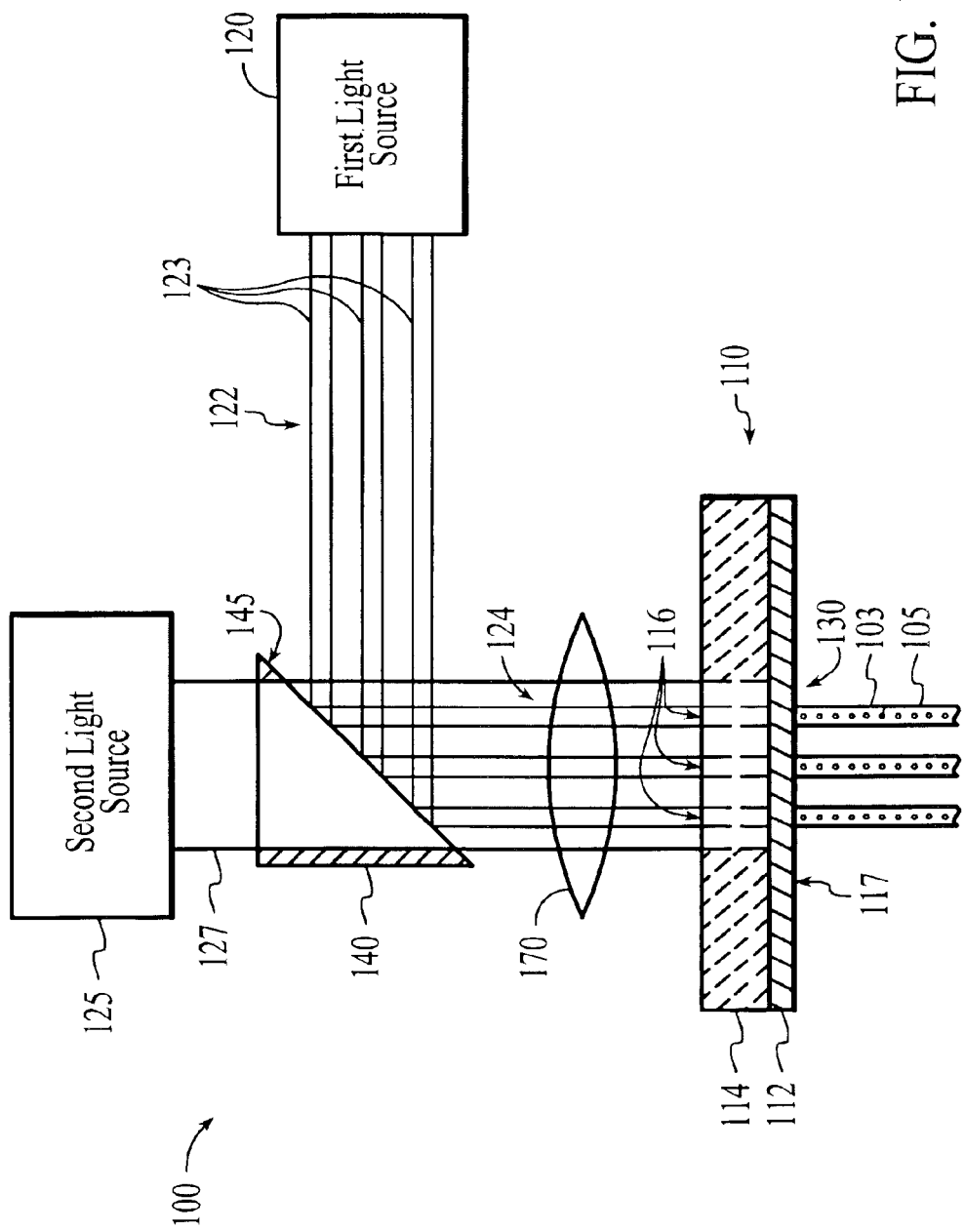
FIG. 1 is a schematic side view of a photocathode electron beam source.

In one embodiment, as illustrated in FIG. 1, the electron beam source 100 comprises a photocathode 110 capable of emitting electrons 105 from an electron emitting portion 130 when illuminated by a suitable light beam. The photocathode 110 typically comprises a transparent layer 114 and a photoemitter material 112. The transparent layer 114 may comprise, for example, glass or a translucent polymer. The photoemitter material 112 may comprise a metal, such as for example, cesium or magnesium. The photoemitter material 112 has an associated work function, which is the characteristic amount of energy that is needed to release an electron from the photoemitter material 112 into the adjacent space.

The photocathode 110 is typically floated at a source voltage relative to the substrate 230, the source voltage being of a magnitude suitable to draw electrons 105 from the electron beam source 100 toward the substrate 230, such as at least about 1 kV, such as of about 50 kV.

The electron beam source 100 further comprises an emission light source 120 adapted to generate an emission light beam 122 to excite the photocathode 110 to emit electrons 105. Typically, the emission light beam 122 is a laser beam. The emission light beam 122 illuminates one or more beam receiving portions 116 of the photocathode 110, passes through the transparent layer 114, and impinges on the photoemitter material 112 to excite electrons in the photoemitter material 112. The emission light beam 122 has a photon energy that is at least about the work function of the photoemitter layer 112, and even greater than the work function. The photon energy of the emission light beam 122 is an energy $E=h \cdot f$, where E is in Joules, f is a frequency of the emission light beam 122 in Hertz, and h is a constant that is approximately equal to $6.63 \cdot 10^{-34}$ J·s, otherwise known as "Planck's constant." The wavelength $\lambda$ of the emission light beam 122 is equal to c, the speed of light, divided by f. For example, the emission light beam 122 may comprise ultraviolet (UV) light.

In one version, the emission light beam 122 comprises a plurality of light beamlets 123 to illuminate a plurality of beam receiving portions 116 and generate a plurality of electron beams 103. For example, these light beamlets 123 may be arranged in an array 124. The light beamlets 123 may be independently modulated at the emission light source 120 to individually modulate the resulting electron beams 103. In an alternative embodiment, the electron beams 103 are modulated directly by the application of electric or magnetic fields in the vicinity of the electron beams 103.

The electron beam source 100 further comprises a second light source 125 adapted to generate a second light beam 127 and direct the second light beam 127 onto the beam receiving portion of the photocathode 110. The second light beam 127 stabilizes the current level of the electron beam 103 from the photocathode 110 by keeping the surface 117 of the photocathode 110 relatively clean and free of contaminants that would otherwise deteriorate the photoemitter material 112. The stabilized electron beam 103 has an electron current level with a decreased extent or frequency of fluctuation. However, the stabilizer light beam 127 should not, on its own, cause electrons to be emitted from the photocathode 110 since this would affect the intended modulation of the electron beam 103 by the emission light beam 122. Thus, the stabilizer light beam 127 has a wavelength $\lambda_2$ such that the photon energy $hc/\lambda_2$ of the stabilizer light beam 127 is less than about the work function of the photoemitter material 112. The stabilizer light source 125 comprises an electrical or chemical light generator capable of generating the stabilizer light beam 127, such as a LASER (light amplification by stimulated emission of radiation) beam source, LED (light-emitting diode), or fluorescent or incandescent lamp. For example, the stabilizer light source 125 may emit a stabilizer light beam 127 having components in the ultraviolet, visible or infrared parts of the electromagnetic spectrum. In one embodiment, the emission light beam 122 has a wavelength of less than about 257 nm, and the stabilizer light beam 127 has a wavelength of at least about 1060 nm.

Reactions between the photoemitter material 112 and residual gases or other contaminants in the vacuum chamber have been observed in conventional electron beam sources that are absent a stabilizer light source 125, particularly in the time periods after blanking off the electron beam 103. Residual and contaminant particles (not seen) tend to collect on the surface 117 of the photocathode 110, especially when the electron beam 103 is blanked off. These adverse contaminants result in fluctuations in the electron beam current from the photocathode 110. The stabilizer light source 125 improves the emission current stability of the photocathode 110 by cleaning the photocathode 110. The stabilizer light beam 127 illuminates and heats the surface 117, causing the deposited particles to photodesorb and vaporize, leaving the surface 117 and thus substantially reducing reaction of the residual and contaminant particles with the photoemitter material 112. The stabilizer light beam 127 also prevents further accumulation of the residual and contaminant particles on the surface 117 by maintaining the surface 117 in an illuminated and heated state. The stabilizer light beam 127 also increases the diffusion of defects in the bulk and on the surface of the photoemitter material 112, which can be advantageous to compensate for certain types of defects. The stabilizer light source 125 described herein advantageously provides increased stability of the electron emission current. This is particularly important when a beam is turned off for several minutes, then turned back on. The photoyield, or electron emission relative to the intensity of the emission light beam 122, typically changes during this time. For example, the electron beam source 100 may achieve a stability of less than about 1% at frequencies less than about 1 MHz, compared to typically several percent for conventional beam sources.

The emission and stabilizer light sources 120, 125 are independently controlled, meaning that the emission and stabilizer light sources 120, 125 can each be turned on and off substantially without affecting the other's operation. Typically, the emission light beam 122 is switched on and off to control electron emission from the photocathode 110, while the stabilizer light beam 127 is kept on to maintain a high level of electron emission stability from the photocathode 110. When the emission light beam 122 is not illuminating the photoemitter layer 112, the stabilizer light beam 127 is typically illuminating the photoemitter layer 112 and there is substantially no electron emission from the photocathode 110.

The spot size of the stabilizer light beam 127 can be independently controlled by adjustment of a diverging beam expander 128 in the optical path of the stabilizer light source 125. The diverging beam expander 128 may comprise, for example, a diverging lens that spreads the stabilizer light beam 127 over the beam receiving portion 116 of the photocathode 110. For example, the stabilizer light beam 127 may be adjusted to have a diameter of at least about 2 times the diameter of the emission light beam 122.

Figure 2:
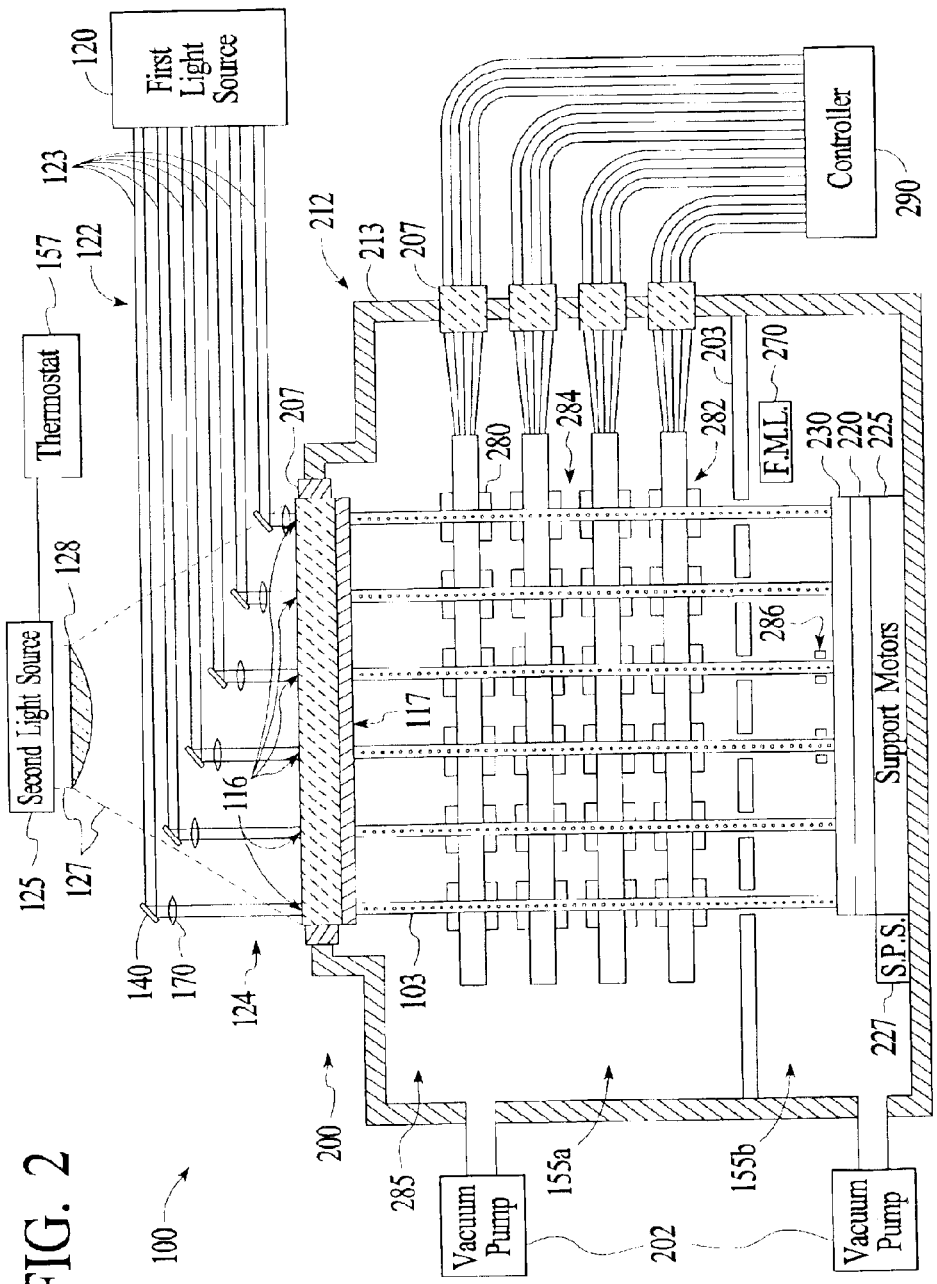
FIG. 2 is a schematic side view of an electron beam apparatus comprising the photocathode electron beam source.

In one embodiment, the plurality of emission light beamlets 123 are directed onto beam receiving portions 116 of the photocathode 110, and the stabilizer light beam 127 contiguously covers these beam receiving portions 116. For example, as illustrated in FIG. 2, the stabilizer light beam 127 may comprise a floodbeam that surrounds the entire array 124 of the light beamlets 123. The area and power density of the stabilizer illumination can be thus adjusted independent of the emission light beam 122 to produce the desired cleaning results for mitigation of adverse blanking effects. In one embodiment, the light beamlets 123 have a diameter of less than about a micron, and the stabilizer light beam 127 has a diameter of at least about 80 microns, such as about 100 microns.

In one version, the electron beam source 100 comprises a wavelength dependent mirror 140 to combine and collimate the emission and stabilizer light beams 122, 127 such that they overlap at the beam receiving portion 116 of the photocathode 110. For example, the wavelength dependent mirror 140 may have the shape of a prism (as in FIG. 1) or may be substantially flat (as in FIG. 2). The wavelength dependent mirror 140 comprises a layer that is reflective to the emission light beam 122 in one direction and transmissive to selected wavelengths of the stabilizer light beam 127 in the other direction. The emission light beam 122 reflects from a face 145 of the wavelength dependent mirror 140 and goes to the photocathode 110. The stabilizer light beam 127 passes through the wavelength dependent mirror 140 and emerges from its face 145, such that it is collimated with the emission light beam 122.

A lens 170 may be provided to direct the emission or stabilizer light beams 122, 127 onto the photocathode 110 by focusing, shaping, or otherwise controlling the intensity distribution of the light beams 122, 127 applied to the photocathode 110. Typically, the lens 170 comprises a material that has a high translucency to the emission and/or stabilizer light beams 122, 127 to minimize energy loss. For example, the lens material may be substantially translucent to one or more frequencies of the light beams 122, 127, such as frequencies that will efficiently transfer heat to the photocathode 110. The lens 170 may comprise, for example, fused silica, aluminum oxide, which may be in the form of polycrystalline alumina, sapphire, or ruby, and may also be doped. The lens 170 may also comprise other materials that minimize energy loss of the light beams 122, 127 or have a low coefficient of expansion.

In the embodiment shown in FIG. 1, the lens 170 is adapted to direct the light beams 122, 127 onto the beam receiving portion 116 of the photocathode 110 to energize electrons 105 in the photoemitter layer 112 of the photocathode 110. In one embodiment, the lens 170 focuses the light beams 122, 127 substantially on the beam receiving portion 116, such as onto the back of the photoemitter layer 112. In this embodiment, the lens 170 may have a convex or biconvex shape. For example, the lens may be a drum lens, ball lens, or barrel lens. However, the lens 170 may also be adapted to spread and distribute the light beams 122, 127 across the surface of the beam receiving portion 116. In this alternative embodiment, the lens 170 typically has a concave or biconcave shape. The lens 170 may also be shaped to fit into the space of the beam receiving portion 116. For example, if the beam receiving portion 116 comprises a concave shaped surface that forms a recess, then the lens 170 may have a convex shape that is sized to fit into the concave shaped recess. In one embodiment, the lens 170 has at least 3 optical elements, such as ten optical elements. The lens 170 may be positioned such that an axis passing centrally and orthogonally through the lens 170 is substantially orthogonal to the plane of the photocathode 110. This allows the lens 170 to direct substantially all of the light beams 122, 127 onto the beam receiving portion 116 of the photocathode 110, thereby increasing the absorption efficiency of the emission or stabilizer light beam 122, 127.

When temperature control is desirable, a thermostat 157 that uses a temperature measurement feedback loop to control the stabilizer light source 125 may be provided to maintain the photocathode 110 at the desired temperature. The thermostat 157 uses a mechanical, thermal, or electrical feedback loop to monitor and to control the heat applied to the photocathode 110, such as by adjusting the stabilizer light source 125. The stabilizer light source 125 is controlled to apply an average level of illumination to the photocathode 110 to set the temperature of the photocathode 110 to within an acceptable range. When the temperature of the photocathode 110 goes below or above the desired setpoint range, the stabilizer light source 125 is powered up or down, respectively, to increase or decrease the flux intensity of the stabilizer light beam 127 applied to the photocathode 110.

The electron beam source 100 according to the present invention may be used in many different applications as would be apparent to one of ordinary skill in the art. For example, the electron beam source 100 may be used in an electron beam apparatus 200 according to the present invention, an exemplary version of which is illustrated in FIG. 2. The electron beam apparatus 200 may be used to generate or inspect a pattern on a substrate 230. Thus, the illustrative apparatus 200 provided herein should not be used to limit the scope of the invention, and the invention encompasses equivalent or alternative versions, as would be apparent to one of ordinary skill in the art.

In operation, the apparatus 200 generates a pattern on a substrate 230 using the electron beams 103. Typically, the substrate 230 comprises one or more dielectric, semiconducting, or conducting materials, including, for example, metal, polymer, or ceramic materials, which may be formed as layers of the substrate 230. The substrate 230 may comprise, for example, a blank mask comprising a transparent plate of glass or quartz, that is coated with a resist layer and a chrome layer; a silicon wafer; a compound semiconductor wafer; a printed circuit board (PCB); or a multichip module (MCM). The patterns generated on the substrate 230 may comprise a pattern of an integrated circuit (IC) or a circuit layout of a PCB. After generation of the pattern on the substrate 230, the layers are etched to form features (not shown) such as electrically interconnecting wiring or vias, or active or passive devices, such as for example, resistors, transistors, and capacitors. The features may be shaped as, for example, lines, plugs, cavities, channels, holes and trenches, which are shaped and patterned according to the pattern generated on the substrate 230.

Generally, the electron beam apparatus 200 comprises a vacuum chamber 212 adapted to provide one or more vacuum environments 155*a,b* to generate an electron beam for generating or inspecting a pattern on the substrate 230. The vacuum chamber 212 comprises walls 213 that are substantially vacuum-tight during operation of the apparatus 200 and are made of a material suitable to enclose the vacuum environments 155*a,b*, such as aluminum. One or more vacuum pumps 202 are provided to evacuate the chamber 212 to create and maintain the vacuum environments 155*a,b*. In one embodiment, the vacuum pumps 202 provide a first vacuum environment 155*a* at the top portion of the vacuum chamber 212, and a second vacuum environment 155*b* which may maintain a different gas pressure at the bottom portion of the vacuum chamber 212. For example, the first vacuum environment 155*a* may maintain a gas pressure of about $10^{-9}$ Torr and the second vacuum environment 155*b* may maintain a gas pressure of about $10^{-6}$ Torr. A pressure barrier 203 may also be provided between the vacuum environments 155*a,b* to help maintain the pressure difference.

The apparatus 200 further comprises one or more apparatus beam components 285 that include the electron beam source 100, an electron detector 286, and an electron beam focuser and scanner 280, which cooperate to generate, focus, scan, and, optionally, detect the electron beams 103 that are directed along beam pathways 284 toward the substrate 230. The photocathode 110 of the electron beam source 100 according to the present invention is positioned in the vacuum chamber 212 so that the emitted electrons 105 are directed to and can be modulated and scanned by the electron beam focuser and scanner 280.

The emission or stabilizer light sources 120, 125 of the electron beam source 100 may be positioned inside or outside the vacuum chamber 212. In the embodiment shown in FIG. 2, the light sources 120, 125 are outside the chamber 212 and the light beams 122, 127 are passed into the vacuum chamber 212 by means of the photocathode's transparent layer 114 passing through a wall 213 of the vacuum chamber 212. The photocathode 110 may also be surrounded by a vacuum feedthrough 207 to maintain a gas-tight seal around the transparent layer 114. The vacuum feedthrough 207 has a shape suitable to maintain the gas-tight seal, for example, an O-ring, or a metal gasket, or a material also suitable to maintain the gas-tight seal, such as rubber or a deformable metal.

Generally, multiple electron beams 103 allow faster and more efficient registration of the substrate 230 than a single electron beam 103 because of simultaneous delivery and/or shorter electron beam scan distances. The electron beam pathways 284 may be straight lines, curved lines, series of connected straight lines, or any other pathways 284 traversed by the electron beams 103. Thus, the electron beam column 282 may be vertically oriented in a column above the substrate 230 (as shown), or may be oriented in an angled configuration (not shown), such as a right-angled configuration, or may be oriented in a curved configuration (also not shown). The electron beam focuser 280 may include one or more of an electron beam lens, demagnifier, accelerator, and deflector. The deflector may be an electrostatic or magnetic electron beam deflector.

The electron beam apparatus 200 comprises a substrate support 220 capable of supporting the substrate 230 in the vacuum chamber 212. The support 220 may comprise an electrostatic chuck (not shown) capable of holding the substrate 230 against the support 220. The apparatus 200 may also comprise support motors 225 capable of moving the support 220 to precisely position the substrate 230 in relation to the apparatus 200 or to move the substrate 230 to scan the electron beams 103 across the substrate 230. For example, the support motors 225 may comprise electric motors that translate the support 220 in the x and y directions along an x-y plane parallel to the substrate surface, rotate the support 220, elevate or lower the support 220, or tilt the support 220. The apparatus 200 may further comprise support position sensors 227 capable of precisely determining the position of the support 220. For example, the support position sensors 227 may receive a light signal from the support 220 to determine the distance between the support 220 and the support position sensors 227.

The apparatus 200 may further comprise a fiducial mark locator 270 capable of locating fiducial marks (not shown) on the substrate 230. The fiducial marks may be used as reference points of the substrate 230. For example, the fiducial marks of the substrate 230 may be useful for correcting an electron beam pattern to be generated on the substrate 230. Fiducial marks may move relative to their intended locations during processing of the substrate 230. The degree of movement or misalignment of the fiducial marks may vary at different regions of the substrate 230 depending upon the localized stresses or distortions of the substrate 230, or the apparatus that placed the fiducial mark.

Figure 3:
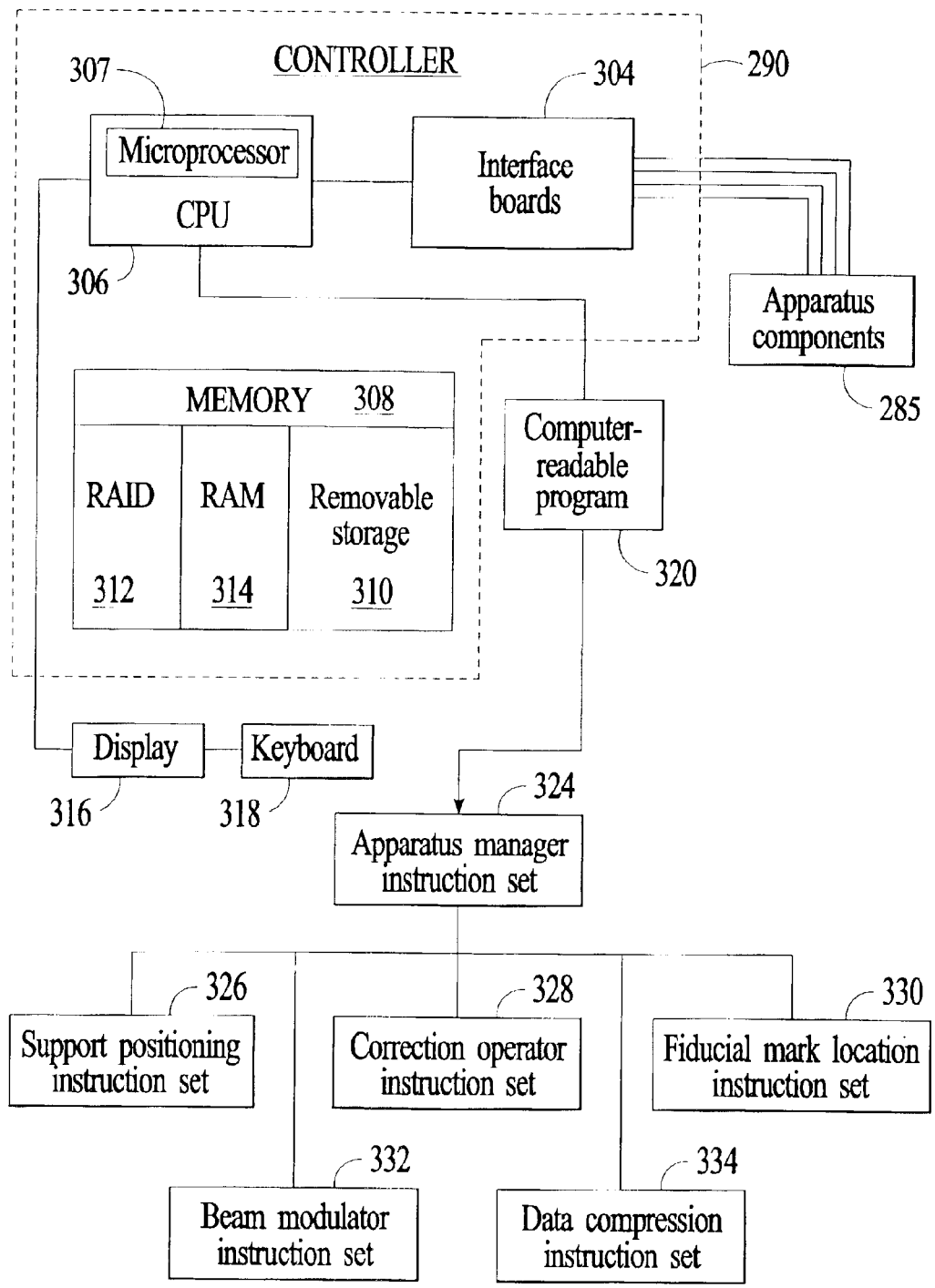
FIG. 3 is a block diagram of a controller and computer-readable program for operating the electron beam apparatus.

The apparatus 200 further comprises a controller 290 that has a suitable configuration of hardware and software to operate the apparatus components 285 to process and generate an electron beam pattern on the substrate 230. An exemplary controller 290 is illustrated in FIG. 3. For example, the controller 290 may comprise a central processing unit (CPU) 306 that is connected to a memory 308 and other components. The CPU 306 comprises a microprocessor 307, such as a complex instruction set computer (CISC) processor, for example a Pentium (™) microprocessor commercially available from Intel Corporation, Santa Clara, Calif., or a reduced instruction set computer (RISC) processor, capable of executing a computer-readable program 320. The memory 308 may comprise a computer-readable medium such as hard disks in a redundant array of independent disks (RAID) configuration 312, removable storage 310 such as an optical compact disc (CD) or floppy disk, random access memory (RAM) 314, and/or other types of volatile or non-volatile memory. The interface between a human operator and the controller 290 can be, for example, via a display 316, such as a cathode ray tube (CRT) monitor, and an input device, such as a keyboard 318. The controller 290 may also include interface boards 304 such as analog and digital input/output boards, linear motor driver boards, or stepper motor controller boards.

The computer-readable program 320 generally includes software comprising sets of instructions to operate the apparatus components 285, and an apparatus manager instruction set 324 to manage the instruction sets. The computer-readable program 320 can be written in any conventional programming language, such as for example, assembly language, C, C++ or Pascal. Suitable program code is entered into a single file, or multiple files, using a conventional text editor and stored or embodied in the memory 308 of the controller 290. If the entered code text is in a high level language, the code is compiled, and the resultant compiler code is then linked with an object code of pre-compiled library routines. To execute the linked, compiled object code, the user invokes the feature code, causing the CPU 306 to read and execute the code to perform the tasks identified in the computer-readable program 320. Using a keyboard interface, a human user enters commands or registration parameters into the computer readable program 320 in response to menus or screens displayed on the display 316. The computer-readable program 320 may include instruction sets to, for example, control the support positioning 326, correction operators 328, fiducial mark location 330, beam modulation 332, and data compression 334. The instruction sets may receive parameters, such as a data file corresponding to the electron beam pattern, the fiducial mark locations, the support position, or instructions entered by the human operator.

The controller 290 is adapted to generate, send, and receive signals to operate the apparatus components 285 to generate or inspect an electron beam pattern on the substrate 230. For example, the controller 290 may send signals to the emission light source 120 to control modulation of the electron beams 103 to the desired intensity levels and in correspondence to the electron beam pattern bitmap. The emission light source 120 may also be controlled to scale the electron beam pattern in the scanning direction by timing the beam pulses, and the support motors 225 may also receive real-time instructions from the controller 290 to control the motion of the substrate 230 to scale, rotate, or offset the pattern generated on the substrate 230. As another example, the controller 290 may also operate the fiducial mark locator 270 by receiving measured locations of the fiducial marks and comparing them to their intended locations to determine the deviation of each fiducial mark.

Although the present invention has been described in considerable detail with regard to certain preferred versions thereof, other versions are possible. For example, the present invention could be used with other electron beam apparatuses, such as an apparatus that inspects a substrate using electron beams. For example, the electron beam source 100 may also comprise other equivalent configurations as would be apparent to one of ordinary skill in the art. As another example, the electron beam source 100 may comprise a plurality of photocathodes 110. Thus, the appended claims should not be limited to the description of the preferred versions contained herein.

What is claimed is:

1. An electron beam source comprising:
   (a) a photocathode comprising a photoemitter material having a work function, the photocathode comprising a beam receiving portion and an electron emitting portion;
   (b) a first light source that generates a first light beam having a wavelength $\lambda_1$ that is directed onto the beam receiving portion of the photocathode to emit an electron beam from the electron emitting portion, the wavelength $\lambda_1$ having a value such that $hc/\lambda_1$ is at least the work function of the photoemitter material, where 'h' is Planck's constant and 'c' is the speed of light; and
   (c) a second light source that generates a second light beam having wavelength $\lambda_2$ that is directed onto the beam receiving portion of the photocathode, the wavelength $\lambda_2$ having a value such that $hc/\lambda_2$ is less than the work function of the photoemitter material.

2. An electron beam source according to claim 1 further comprising a wavelength dependent mirror to reflect the first light beam therefrom and pass the second light beam therethrough, such that the first and second light beams are collimated to overlap at the beam receiving portion of the photocathode.

3. An electron beam source according to claim 1 wherein the second light source comprises a diverging beam expander to adjust the second light beam to have a diameter of at least 2 times a diameter of the first light beam.

4. An electron beam source according to claim 1 comprising a first light source that generates a plurality of first light beamlets that are directed onto a plurality of beam receiving portions of the photocathode, and the second light source comprises a diverging beam expander to adjust the second light beam to contiguously covers the plurality of beam receiving portions of the photocathode.

5. An electron beam source according to claim 1 comprising a first light source that generates a first light beam having a wavelength of less than 257 nm and a second light source that generates a second light beam having a wavelength of at least 1060 nm.

6. An electron beam apparatus for generating or inspecting a pattern on a substrate, the apparatus comprising:
   (a) a vacuum chamber;
   (b) a substrate support to support a substrate;
   (c) an electron beam source to provide an electron beam in the vacuum chamber, the electron beam source comprising:
      (i) a photocathode comprising a photoemitter material having a work function, the photocathode comprising a beam receiving portion and an electron emitting portion,
      (ii) a first light source that generates a first light beam having a wavelength $\lambda_1$ that is directed onto the beam receiving portion of the photocathode to emit an electron beam from the electron emitting portion, the wavelength $\lambda_1$ having a value such that $hc/\lambda_1$ is at least the work function of the photoemitter material, where 'h" is Planck's constant and 'c' is the speed of light, and
      (iii) a second light source that generates a second light beam having a wavelength $\lambda_2$ that is directed onto the beam receiving portion of the photocathode, the wavelength $\lambda_2$ such that $hc/\lambda_2$ is less than the work function of the photoemitter material; and
   (d) an electron beam focuser and scanner to focus and scan the electron beam across the substrate to generate or inspect a pattern on the substrate.

7. An electron beam apparatus according to claim 6 further comprising a wavelength dependent mirror adapted to reflect the first light beam therefrom and pass the second light beam therethrough, such that the first and second light beams are collimated to overlap at the beam receiving portion of the photocathode.

8. An electron beam apparatus according to claim 6 wherein the second light source comprises a diverging beam expander to adjust the second light beam to have a diameter of at least 2 times a diameter of the first light beam.

9. An electron beam apparatus according to claim 6 comprising a first light source that generates a plurality of first light beamlets that are directed onto a plurality of beam receiving portions of the photocathode, and the second light source comprises a diverging beam expander to adjust the second light beam to contiguously covers the plurality of beam receiving portions of the photocathode.

10. An electron beam apparatus according to claim 6 comprising a first light source that generates a first light beam having a wavelength of less 257 nm and a second light source that generates a second light beam having a wavelength of at least 1060 nm.

* * * * *